United States Patent [19]

Pocholle et al.

[11] Patent Number: 5,311,540
[45] Date of Patent: May 10, 1994

[54] LASER WITH COUPLED OPTICAL WAVEGUIDES

[75] Inventors: Jean-Paul Pocholle, Arpajon/La Norville; Eric Lallier, Levallois; Michel Papuchon, Villebon, all of France

[73] Assignee: Thomson Composants Militaires et Spatiaux, Courbevoie, France

[21] Appl. No.: 849,077

[22] PCT Filed: Sep. 10, 1991

[86] PCT No.: PCT/FR91/00715
§ 371 Date: Apr. 28, 1992
§ 102(e) Date: Apr. 28, 1992

[87] PCT Pub. No.: WO92/04748
PCT Pub. Date: Mar. 19, 1992

[30] Foreign Application Priority Data

Sep. 11, 1990 [FR] France .................. 90 11204

[51] Int. Cl.$^5$ .................................. H01S 3/082
[52] U.S. Cl. ............................ 372/97; 372/50;
372/23; 372/71; 372/70; 385/3
[58] Field of Search ............... 372/71, 70, 92, 50,
372/97, 23, 6; 385/1, 2, 3

[56] References Cited

U.S. PATENT DOCUMENTS

| | | | |
|---|---|---|---|
| 3,725,809 | 4/1973 | Ulrich et al. | 372/94 |
| 4,714,312 | 12/1987 | Thaniyavarn | 385/3 |
| 4,763,975 | 8/1988 | Scifres et al. | 385/15 |
| 4,878,724 | 11/1989 | Thaniyavarn | 385/3 |
| 5,121,400 | 6/1992 | Verdiell et al. | 372/97 |

FOREIGN PATENT DOCUMENTS 2095419 9/1982 United Kingdom .

OTHER PUBLICATIONS

SPIE, vol. 1131, Optical Space Communication, Paris, Apr. 24–26, 1989, E. Lallier et al.: "Towards a laser diode pumped Nd:LiNbO3 waveguide laser", pp. 247–251.

*Primary Examiner*—Georgia Y. Epps
*Attorney, Agent, or Firm*—Oblon, Spivak, McClelland, Maier & Neustadt

[57] ABSTRACT

The invention relates to lasers, and more particularly to solid state lasers such as neodymium on lithium niobate crystal lasers. The invention provides a structure with several juxtaposed optical waveguides (12) sufficiently close to each other laterally to be coupled laterally. In order to take into account the risks of inhomogeneity in the refractive indices or inaccuracies in the dimensions which would alter the distribution of the electromagnetic field of the propagation supermode in the coupled structure, it is proposed to act on the value of the index of propagation in each guide using an individual control (generally electrical). Because of the variation in index, individually controlled, phase differences in the laser wave between the different guides are produced and these phase differences react on the composition of the electromagnetic field defining the supermode. It is possible to go as far as modifying the directivity of the laser beam by this electrical control. The control is preferably achieved by electrodes (14) placed in the vicinity of each guide. The guides are made of an electro-optical material such as lithium niobate, and neodymium doping, for example, allows the laser effect to appear in the very interior of the guides.

13 Claims, 6 Drawing Sheets

LASER WITH COUPLED OPTICAL WAVEGUIDES

BACKGROUND OF THE INVENTION

The invention relates to coherent optical sources, particularly solid state lasers.

Lasers operating on the principle of a structure with multiple parallel optical waveguides coupled laterally with each other (multiple optical waveguide structure) have already been devised.

In these structures, if the optical waveguides are placed side by side, very close to each other, there is a mutual coupling of the optical wave travelling in one guide with the optical wave of neighbouring guides. It is therefore possible by making use of the mutual coupling between guides, i.e. in practice by correctly choosing the distances between neighbouring guides, to obtain at the output optical waves that are coherent, with a distribution of electric field, and therefore of light energy, which is not the simple superposition of the electric fields produced in each guide but which is a composition corresponding to a mode of propagation characteristic of the multiple guide structure.

Consequently, whereas uncoupled juxtaposed guides would lead to a distribution of light energy distributed uniformly between the outputs of the different guides, mutual optical coupling can lead to a non-uniform energy distribution, possibly concentrated at the centre, for example with a shape that is approximately Gaussian. Such a structure is thus very worthwhile since it enables the energy from a spatially distributed output to be concentrated.

Unfortunately, experiment shows that practical realization is very difficult. In effect, it is very difficult to control the dimensions and homogeneity of optical waveguides, and nobody has actually succeeded in making a laser operate in this way, with a beam really possessing an overall natural mode produced from the individual modes of the different guides. A correct concentration of energy is therefore not obtained.

An attempt has been made to achieve this, for example with semiconductor lasers, in which the emission of light is stimulated by the injection of currents into the junctions. However, it is realised that the injection of current alters the refractive indices in the guides. These changes in index modify the phases of the optical waves. There is a failure to obtain in the different guides a distribution of phases which would combine to give a beam intensity distributed spatially in the desired manner.

SUMMARY OF THE INVENTION

The invention proposes a method of producing a laser operating on the principle of multiple optical waveguide structures and having an intensity distribution of desired output.

According to the invention, a laser is proposed comprising a plurality of juxtaposed parallel optical waveguides having a mutual lateral optical coupling between them, with means for individually controlling the refractive index in the different guides or between the different guides. Through this individual local control of the indices, it is possible to control the relative phases of the optical wave in the different guides and hence the overall distribution of light intensity at the output of the coupled structure.

The preferred embodiment is as follows: the optical waveguides are made from an electro-optical material and provision is made for control electrodes placed in the vicinity of the guides in order to achieve individual control of the refractive index in the guides, and for means of applying individual potentials to these electrodes so as to adjust the relative phases of the wave in the different guides. This adjustment of phase is carried out through the intermediary of an adjustment of the effective refractive index in a guide; the index of the guide depends on the potential applied to an electrode placed near this guide because the guide is made of an electro-optical material.

In this embodiment, the optical waveguides form an integral part of the resonant cavity producing the laser effect. Plane mirrors or other means of reflection are placed at the ends of the guides in order to form this cavity.

It is possible in this way to produce a solid laser in a substrate on which are formed optical waveguides made of a material capable of the emission of stimulated light, provided that this material has electro-optical properties, i.e. has in practice a controllable effective refractive index.

Neodymium-doped lithium niobate (Nd: $LiNbO_3$), for example, is a solid material capable of being stimulated and in addition it is electro-optical, i.e. its refractive index can be electrically controlled.

More generally, other materials with electro-optical properties can be used if they enable optical waveguides to be produced and if they can be doped in order to allow laser emission. This assumes, in general, that the material is crystalline and transparent to the wavelength of the laser transition and also transparent, when the emission is stimulated by a pumping laser, to the wavelength of the pumping laser. Lithium tantalate is an example of such a material.

In a particular embodiment, plane mirrors are arranged at the ends of the guides in order to form a laser cavity. In another embodiment, the mirrors are replaced by distributed Bragg lattices at the ends of the guides, these lattices having the known property of reflecting electromagnetic waves with a particular wavelength (equal to twice the lattice pitch divided by the effective refractive index in the guides).

For exciting the laser, it is possible to use pumping laser diodes, either individuals or coupled (multistrip laser diode). If separate individual diodes are used, they will preferably be connected to the inputs of the multiple guide laser structure of the invention through the intermediary of an optical transfer system with optical waveguides.

In a variant of the embodiment, the guides of the multiple guide laser structure do not all extend between the mirrors defining the laser cavity. Even so, they are nevertheless all coupled to each other.

BRIEF DESCRIPTION OF THE DRAWINGS

Other characteristics and advantages of the invention will appear when reading the detailed description which follows and which is given with reference to the appended drawings in which.

DETAILED DESCRIPTION OF THE PREFERRED EMBODIMENTS

Figure 1:
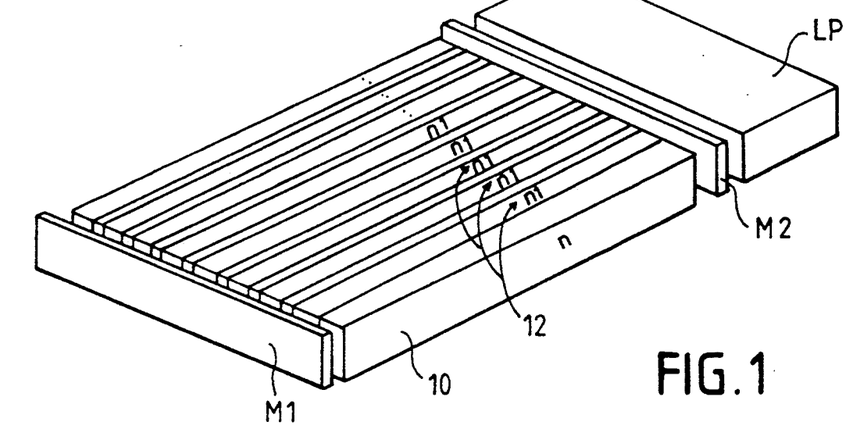
FIG. 1 represents a multiple optical waveguide structure.

FIG. 1 shows a crystalline substrate 10, for example made of lithium niobate, in which juxtaposed optical waveguides 12 have been formed. These guides are produced, for example, by doping longitudinal bands of small width (of the order of the laser emission wavelength, for example of several micrometers for a wavelength of about 1 micrometer). These longitudinal bands, after doping (for example doping with titanium or by proton exchange), have a refractive index n1 higher than the index n of the crystal in which the bands are formed. They therefore form optical waveguides. Their number may be from a few units to several tens or even more.

Mirrors M1 and M2 are placed at the ends of the crystal, separated by a multiple of the laser wavelength, these mirrors being reflecting for this wavelength in order to create a laser cavity with a length from several millimeters to several centimeters, for example.

The optical waveguides are doped, for example, with neodymium, so that they can emit, and their emission is stimulated by a pumping laser LP placed behind one of the mirrors (M2). This mirror M2 must be transparent at the wavelength of the pumping laser, while it is reflecting for the light from the neodymium laser. Such a structure in fact corresponds to a multiplicity of individual lasers each consisting of one of the guides, of the portions of the mirrors which enclose them and of a pumping laser or an element of pumping laser emitting opposite this guide.

Figure 2A:
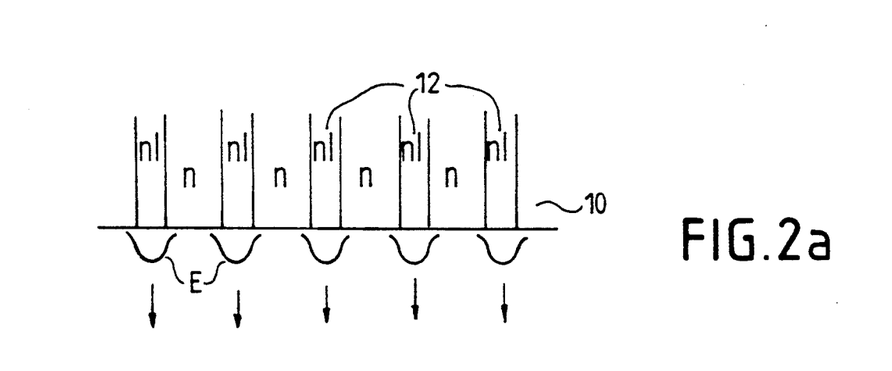
FIGS. 2a and 2b represent the configurations of the electric field at the output of the structure of FIG. 1 for guides that are not coupled (2a) and coupled (2b)

The distribution of the electric field at the output of this structure is that shown in FIG. 2a in the case where the guides are not coupled optically by evanescent waves (for example, because these guides are too far away from each other); each guide propagates a wave with a natural mode corresponding to this guide. The distribution of the field E and hence the light intensity at the output is uniformly distributed between the different guides. In a way, this amounts to a plurality of juxtaposed laser beams but not to a single laser beam.

If now the longitudinal bands are brought closer together to a distance of the order of the wavelength or several wavelengths, there is optical coupling between the guides, i.e. the Maxwell's equations governing the electric fields are no longer subject to the same boundary conditions.

There is interaction between the beams, the electromagnetic field is propagated with a natural mode and the electric field E has a distribution which is very different from the distribution of FIG. 2a. In an entirely feasible theoretical configuration, the interactions between the optical waves lead to the field configuration of FIG. 2b: the concentration of energy is a maximum at the centre. The structure propagates the energy according to a natural mode and not according to the simple juxtaposition of the modes of the individual guides as in FIG. 2a. Everything happens as if there were a single laser with a distribution of energy distributed over a wide region, with a greater concentration at the centre.

However, this optimal configuration only really exists if the optical waves propagating in each of the guides is correctly composed, and the key factor which determines the composition of the electric fields due to two coupled waves is the relative phase of the two waves.

Figure 2B:
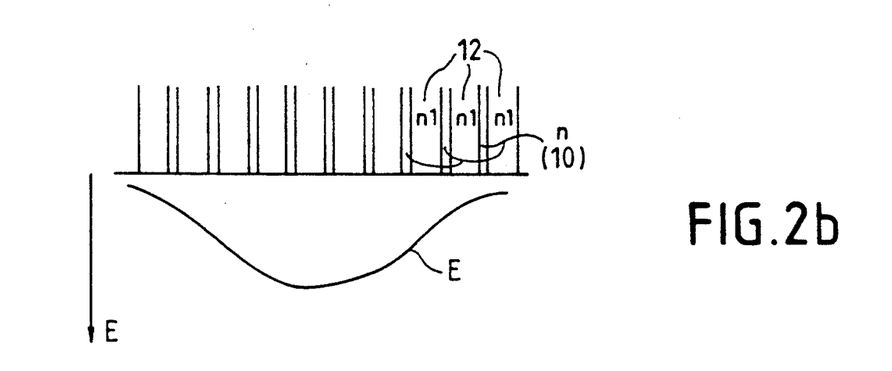

If the structure with coupled guides were perfect, it would easily be possible, by an appropriate choice of the dimensions and spacings of the guides as a function of the refractive indices of the guides and the gaps which separate them, to obtain a composed electric field having the distribution of FIG. 2b.

However, technological limitations do not allow this to be achieved: there are inaccuracies in the production of the desired dimensions and there are inhomogeneities in the materials, the doping, etc, which lead to unpredictable relative phase modifications in the propagated waves.

That is why the invention proposes a local and individual control of the value of the refractive index of the different guides (or at least some of them), given that a variation of the index leads to a phase modification of the propagated wave.

Figure 3:
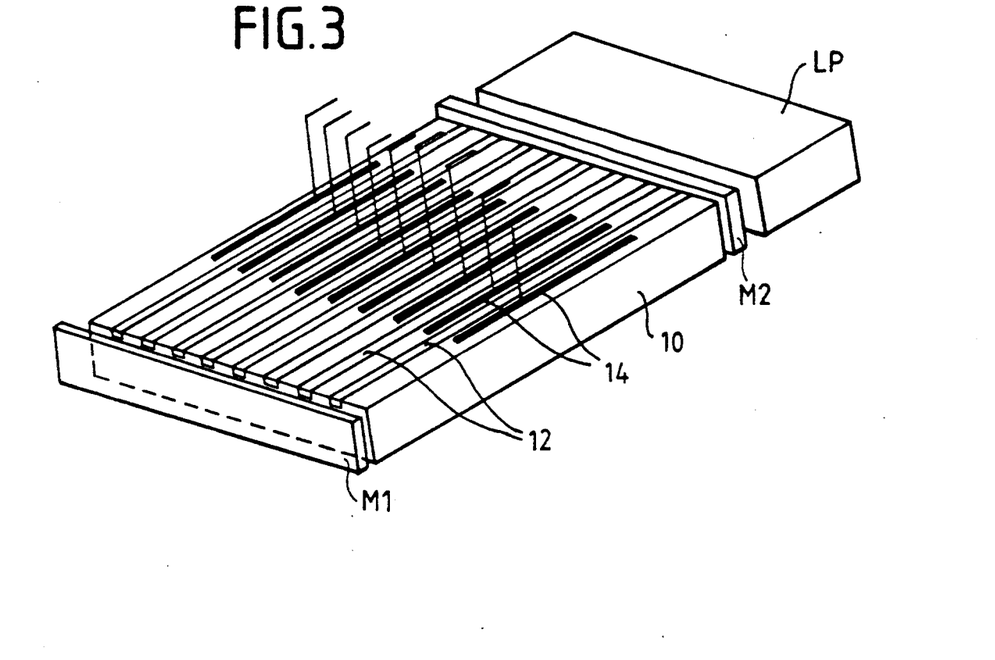
FIG. 3 represents a multiple guide laser structure according to the invention.

FIG. 3 shows the preferred example of an embodiment, which involves placing on each guide or in the immediate vicinity of this guide a control electrode having an electro-optical effect, i.e. creating in the guide (and only in this guide) a variation of the effective refractive index of the propagation medium.

By applying a suitable potential to each electrode, it is possible to adjust the phase of the propagated wave in the corresponding guide relative to the phases in the other guides.

In this way, it is possible to rectify all the phase errors which would be due to inhomogeneities in the optical waveguides or to inaccuracies in the dimensions.

However, it is also possible to use these electrodes to configure the electric field at the output of the structure in a way different from the simplest configuration of FIG. 2b. In effect, the electrode potentials can be used to give, for example, asymmetric electric field configurations such as those of FIG. 4a or FIG. 4b.

In effect, as has been explained, the composition of the electric fields in the coupled guides is directly related to the phases of the waves in the individual guides and the phases are directly influenced by the potentials applied to the electrodes because of the electro-optical properties of the material forming the guides.

In this way, a very important application of the invention is obtained: this is the achievement of a variable directivity of the laser beam, with electrical control of this directivity; this directivity is obtained in the very interior of the laser and not by an optical component placed downstream from the laser.

Figure 4A:
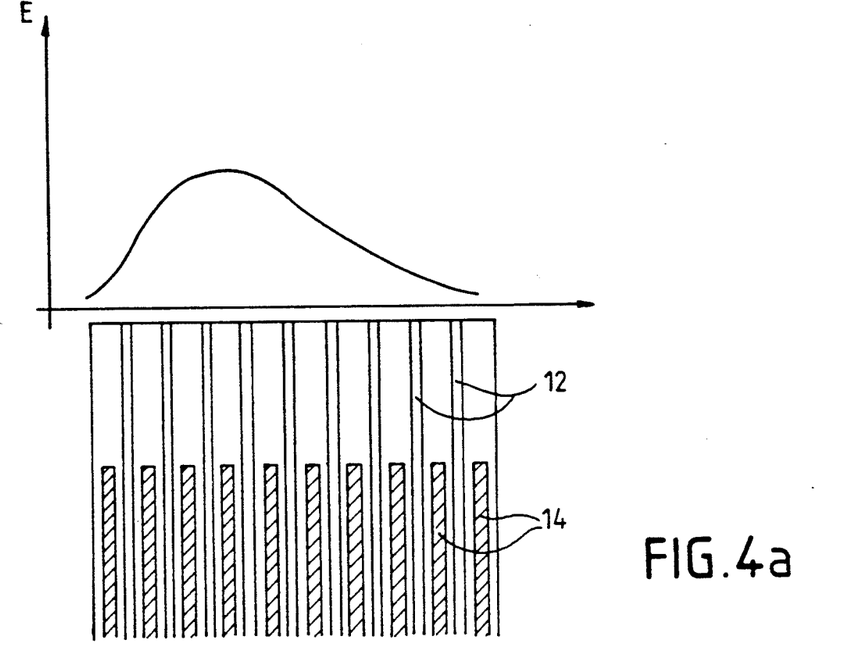
FIGS. 4a and 4b represent some possible distributions of the electric field at the output of the structure of FIG. 3.
Figure 4B:
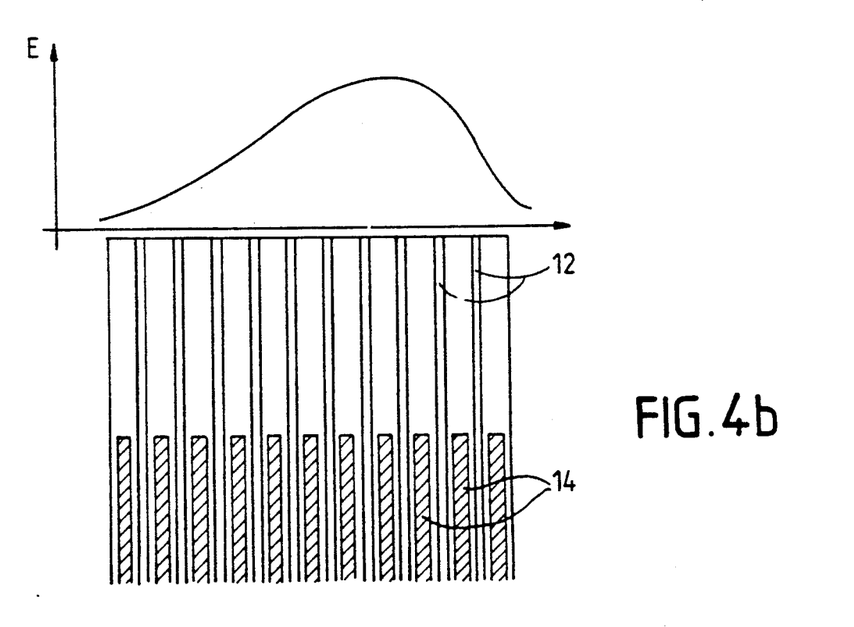

In the case of FIG. 4a, the electric field configuration corresponds directly to a laser beam with energy distributed according to a lobe whose general orientation has an axis offset to the left with respect to the axis of the parallel optical waveguides. In the case of FIG. 4b, the beam is directional and oriented towards the right.

With a variable configuration of potentials, it is possible, if so desired, to achieve the equivalent of a scanning of the laser beam, the direction of maximum beam intensity varying with the applied potentials; this scanning is similar to electronic scanning in radar aerials, in which a scanning of emission directivity is achieved by suitable phase differences between the frequencies emitted by elementary aerials close to each other.

The asymmetric configuration of the electric field in the immediate vicinity of the output from the guides of the structure in effect corresponds to a farfield directional radiation pattern with a lobe which is offset with respect to the axis.

The electrodes 14 intended to modify the respective individual phases of propagation in the different guides 12 may be arranged either just above the guides or between the guides.

In order to produce the laser cavity in the multiple optical waveguide structure according to the invention, there are several methods. One method is the use of mirrors placed at the ends of the guides, separated by a multiple of the laser emission wavelength (about 1.084 micrometers for a neodymium laser). The mirrors may be added or deposited directly on the ends of the structure.

The mirror M2 is characterised by a high transmission coefficient at the wavelength of the pumping laser LP, whereas it has a maximum reflection coefficient at the wavelength of the laser emission. The mirror M1 has a reflection coefficient adjusted as a function of the magnitude of the magnification factor desired for the cavity, taking into account the gain and the losses of the said cavity.

Figure 5:
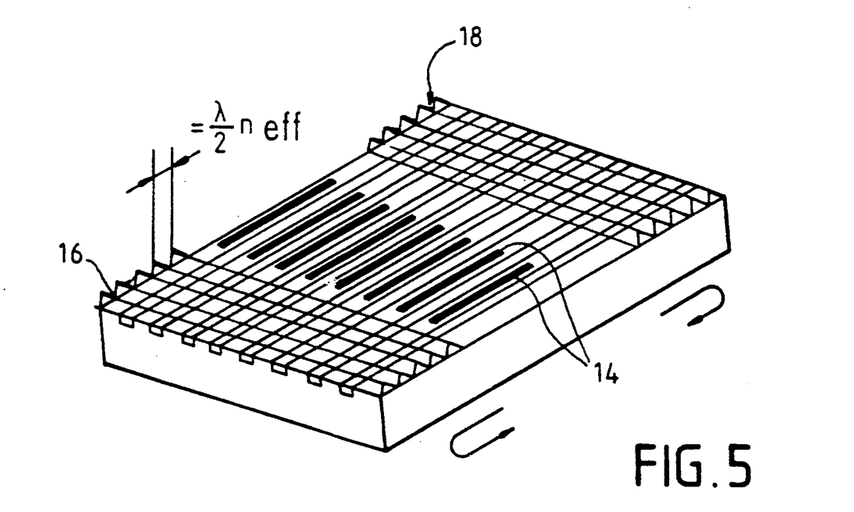
FIG. 5 represents an embodiment with Bragg mirrors in distributed lattices.

Another way of producing the laser cavity is to replace the mirrors by distributed lattices deposited on the structure and having the same function as the mirrors, i.e. capable of sending back an electromagnetic wave of given wavelength. FIG. 5 shows in diagrammatic form the use of such lattices 16 and 18 at each end of the structure; the pitch p of the lattice is chosen equal to the product of the wavelength lambda of the light to be reflected times half the effective refractive index $n_{eff}$ in the structure for its natural mode at the wavelength in question. The electrodes 14 making it possible to modify the natural mode of propagation are placed along the guides between the lattices 16 and 18.

Pumping of the structure is preferably achieved by means of a laser diode or a set of laser diodes. The emission wavelength of the pumping diodes is in resonance with the absorption band of the rare earth ion used (e.g. 0.814 micrometers for neodymium in the $Nd^{3+}$ form inserted in lithium niobate). In order to obtain this precise wavelength in the pumping laser diodes, the compositions and thicknesses of the semiconductor layers based on gallium-aluminium arsenide composing the diodes are controlled. It is also possible to use laser diodes with multiple quantum wells.

Figure 6:
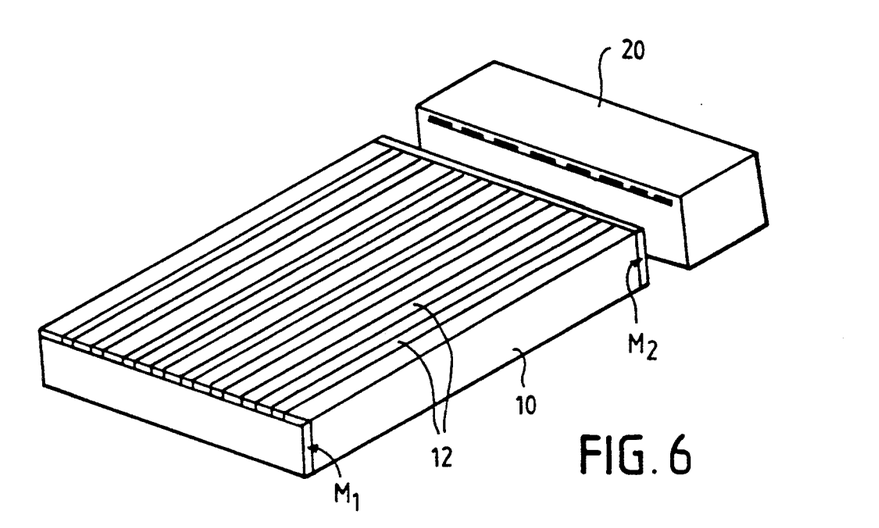
FIG. 6 represents an embodiment with excitation by multistrip laser diode.

The coupling of the pumping wave to the multiple guide structure can be achieved in various ways. The first involves the use of a multistrip laser diode in which the dimension of the natural mode is best matched to that of the natural mode of the multiple guide structure at the pumping wavelength. An optical coupling system can be used at the pumping wavelength for matching these two modes. Such a multistrip diode structure 20 is represented in FIG. 6. The electrodes of the multiple guide structure are not shown in this figure for reasons of simplicity.

Figure 7:
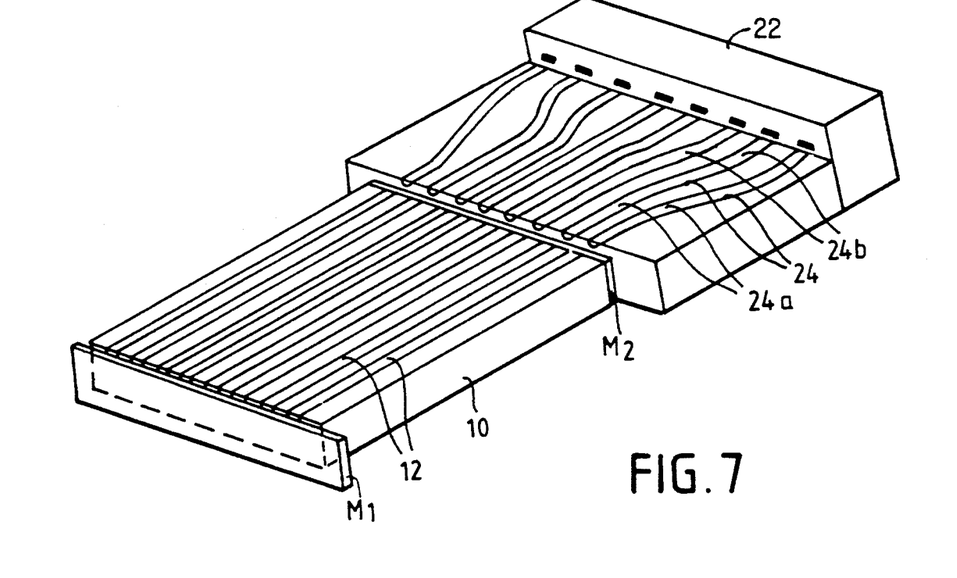
FIG. 7 represents an embodiment with excitation by individual laser diodes, with an optical system for guided optical transfer.

A second method relies on the use of an optical transfer system (FIG. 7) connecting the pumping laser diodes 22 (separated laterally and hence not coupled together) or of a multistrip laser diode at the input of the multiple guide laser structure of the invention. This optical transfer system consists of optical waveguides 24 which, in their upstream part 24b (on the side of the laser diodes 22 or of the multistrip laser diode), are opposite the pumping laser diodes 22 and which get closer together (FIG. 7) or further apart until they are opposite the optical waveguides 12 carried by the substrate 10 in their oval part 24a (on the side of the multiple guide structure according to the invention). The pumping laser light emerges from the diodes 22 and passing through the guides 24 passes through the mirror M2 and comes to excite the rare earth doping of the guides 12 of the laser structure according to the invention. This method is suitable when the pumping wave is made up of a set of light sources independent from each other or of a multistrip diode whose natural mode is different from that of the multiple guide laser structure at the pumping wavelength. The natural mode at the output from the optical transfer system with guides 24 is preferably chosen to be the same as the natural mode of the laser guide 10, 12 at the pumping wavelength. The electrodes 14 are not represented in FIG. 7.

A third method (FIG. 8) involves the use of an integrated optical transfer system with guides coupled between an individual laser diode 26 and the multiple guide structure of the invention. The single laser diode emits a pumping laser beam towards one end of a first guide 28 whose other end is coupled laterally to other guides 30, which themselves are coupled laterally to other guides 32, and so on. By mutual coupling, the injected energy is distributed between these different guides which together form the equivalent of an integrated optical lens; the outputs from these guides 30, 32, etc, are arranged opposite the inputs to the guides of the multiple guide laser structure of the invention. Here again, the phase control electrodes 14 used to establish the desired mode of propagation are not represented.

Figures 8, 9:
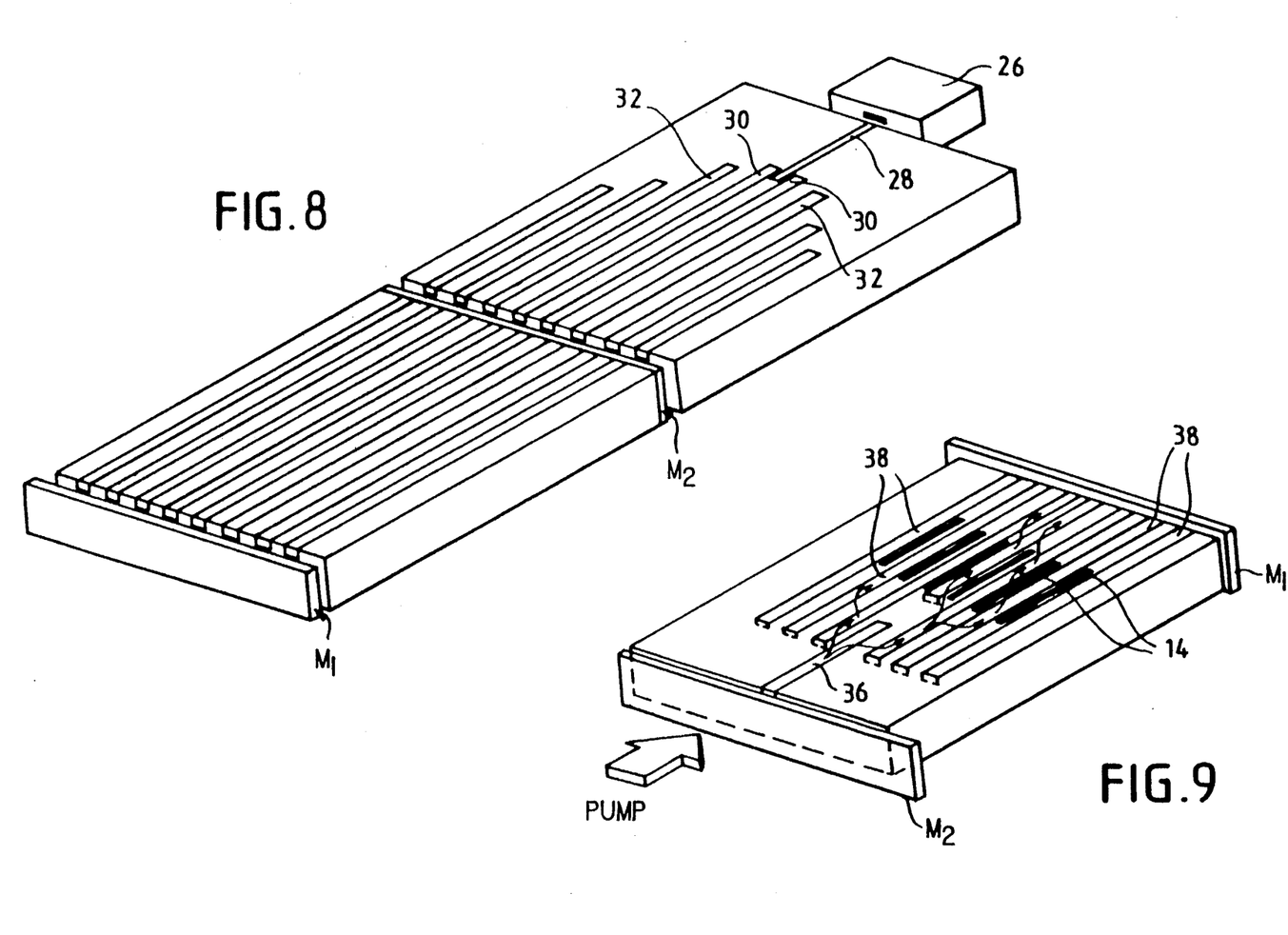
FIG. 8 represents an embodiment with excitation by a single diode, with a guided optical system using guides coupled between this diode and the multiple guide laser structure of the invention.
FIG. 9 represents an embodiment of the multiple guide laser structure with guides not extending between the two mirrors forming the laser cavity.

In yet another embodiment, represented in FIG. 9, the coupled multiple guide laser structure with a propagation supermode consists of guides whose lengths are less than the distance separating the mirrors M1 and M2 which define the laser cavity. Some of the guides reach the immediate vicinity of the mirror M2 in order to receive the pumping laser wave (e.g. guide 36 in FIG. 9) but do not extend as far as the other mirror. Other guides, such as 38, extend to the vicinity of the mirror M1 on the output side of the structure, but do not extend as far as the input mirror M2. The guides 36 and the guides 38 are coupled to each other and the successive coupled guides extending between the two mirrors form cavities in which laser resonance can occur. Electrodes are used here once again to modify the phases in order to adjust the laser propagation supermode of the structure.

Figure 10:
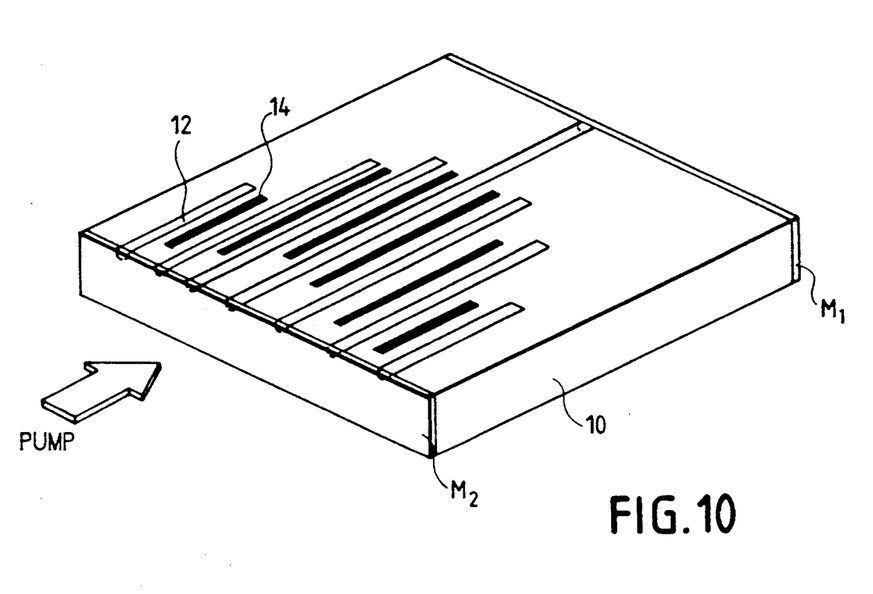
FIG. 10 represents another mode of embodiment of the invention.

In yet another embodiment, represented in FIG. 10, the coupled multiple guide laser structure consists of guides whose lengths are less than the distance separating the mirrors M1 and M2 which define the laser cavity.

In this embodiment, all the guides reach the immediate vicinity of the mirror M2 in order to receive the pumping laser wave, but do not extend as far as the other mirror except for one of the guides (preferably the central guide). The length of each guide is chosen in such a way that, from an equal distribution of energy in the guides at the level of the mirror M2 and at the laser wavelength, maximum energy is retrieved in the central guide extending as far as the mirror M1. The energy is distributed by mutual coupling between the guides, which form the equivalent of an integrated optical lens. Electrodes are used here once again to modify the phases in order to optimise the progressive transfer of the energy to the central guide.

This device makes it possible to increase the available power in a single-mode laser guide thanks to the increase in the number of pumping sources. This is of particular interest if it is desired to couple the output from the laser (at the level of the mirror M1) to a single-mode optical fibre or if it is desired to double the frequency (generation of green radiation at 0.54 $\mu$m in the case of the laser material $Nd:LiNbO_3$ emitting at 1.084 $\mu$m) the laser energy being propagated in the central guide.

We claim:

1. A laser device for providing a desired coherent light output, comprising:
    a substrate comprising a solid material, wherein said solid material is capable of stimulated emission of light in response to optical excitation;
    a plurality of optically coupled juxtaposed optical waveguides, each waveguide having refractive indices, wherein said waveguides are formed in said solid material;
    a source of light energy oriented to direct light energy emitted therefrom toward said solid material; and
    means for individually controlling the refractive indices of different ones of the waveguides so as to control phase relationships of stimulated emission between different ones of the waveguides.

2. A laser structure according to claim 1, wherein:
    said solid material is electrooptically active,
    wherein said means for controlling comprises control electrodes for applying voltages to said electrooptically active solid material,
    wherein each of said control electrodes is disposed on said electrooptically active solid material and each of said control electrodes is disposed adjacent to at least one of said waveguides, and
    wherein said laser structure further comprises means for applying voltages to at least some of said control electrode, whereby said phase relationships are adjusted.

3. A laser device according to claim 1, wherein said solid material comprises a crystalline material selected from a member of the group consisting of lithium niobate and lithium tantalate.

4. A laser device according to one of claims 1, 2 and 3, wherein said substrate material is doped with neodymium.

5. A laser device according to claim 2, wherein at least one of said control electrodes is placed on the substrate directly above a corresponding one of said waveguides.

6. A laser device according to claim 2, wherein at least one of said control electrodes is placed on the substrate between two adjacent ones of said waveguides.

7. A laser device according to one of claims 1 and 2 wherein plane mirrors are placed at two opposite ends of said substrate.

8. A laser device according to one of claims 1 and 2, further comprising:
    at least one distributed reflecting lattice, wherein said distributed reflecting lattice is formed in the substrate near one end of the substrate.

9. A laser device according to one of claims 1 and 2, wherein:
    an optical cavity includes at least part of the substrate and the optical cavity is formed between first and second reflecting means, the first and second reflecting means being separated from one another by a first distance, and
    wherein some of the waveguides have a length that is less than said first distance.

10. A laser device according to one of claims 1 and 2, wherein said source of light energy comprises a semiconductor laser.

11. A laser device according to claim 10, wherein an optical transfer system is provided between said semiconductor laser and said plurality of waveguides, for transferring light from said semiconductor laser to said plurality of waveguides.

12. A method for making a laser device for providing a desired coherent light output, comprising the steps of:
    forming a substrate comprising a solid material, wherein said solid material is capable of stimulated emission of light in response to optical excitation;
    forming in said solid material, a plurality of optically coupled juxtaposed optical waveguides, each waveguide having refractive indices;
    orienting a source of light energy so that light energy produced by the source of light energy is directed toward said solid material; and
    producing control electrodes near the waveguides wherein said control electrodes can individually control the refractive indices of different ones of the waveguides so as to control phase relationships of stimulated emission between different ones of the waveguides.

13. A method for using a laser device for providing a desired coherent light output, said laser device comprising a substrate comprising a solid material, wherein said solid material is capable of stimulated emission of light in response to optical excitation, a plurality of optically coupled juxtaposed optical waveguides, each waveguide having refractive indices, wherein said waveguides are formed in said solid material, a source of light energy oriented to direct light energy emitted therefrom toward said solid material, and means for individually controlling the refractive indices of different ones of the waveguides so as to control phase relationships of stimulated emission between different ones of the waveguides, comprising the steps of:
    emitting light energy from said source of light energy to thereby cause stimulated emission of light in said solid material;
    individually controlling the refractive indices of different ones of the waveguides to thereby control said phase relationships.

* * * * *